United States Patent
Ovalekar

(10) Patent No.: US 6,691,261 B1
(45) Date of Patent: Feb. 10, 2004

(54) DE-INTERLEAVER AND METHOD OF DE-INTERLEAVING

(75) Inventor: Sameer V. Ovalekar, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/411,156

(22) Filed: Oct. 1, 1999

(51) Int. Cl.$^7$ ................................................ G06F 11/00
(52) U.S. Cl. ........................................ 714/701; 714/756
(58) Field of Search ................................ 714/762, 718, 714/701, 756; 375/347; 711/112; 377/26

(56) References Cited

U.S. PATENT DOCUMENTS

| | | | | |
|---|---|---|---|---|
| 5,051,998 A | * | 9/1991 | Murai et al. | 714/762 |
| 5,694,438 A | * | 12/1997 | Wang et al. | 375/347 |
| 5,946,707 A | * | 8/1999 | Krakirian | 711/112 |
| 6,078,636 A | * | 6/2000 | Shirai et al. | 377/26 |
| 6,381,715 B1 | * | 4/2002 | Bauman et al. | 714/718 |

* cited by examiner

Primary Examiner—David Ton
(74) Attorney, Agent, or Firm—Steve Mendelsohn; Ian M. Hughes

(57) ABSTRACT

A counter sequence is mapped with an interleaving algorithm Both the sequence and mapped sequence of values are associated with values in a block of data values and a corresponding block of interleaved values. For a receiver, the mapped counter sequence is employed to generate a sequence of addresses corresponding to of the interleaved block in a buffer. The counter provides a sequence of address values associated with the original sequence of data values before interleaving. Memory addresses for storing the data values in the interleaved block to reconstruct the original block are assigned based on the counter sequence and the mapped counter sequence of values.

10 Claims, 1 Drawing Sheet

DE-INTERLEAVER AND METHOD OF DE-INTERLEAVING

BACKGROUND OF THE INVENTION

1. Field of the Invention

The present invention relates to data transmission in telecommunication systems, and, more particularly, to interleaving and de-interleaving blocks of data.

2. Description of the Related Art

Interleaving is a commonly employed technique in telecommunication systems. Interleaving generally comprises receiving a block of data having BLK values (i.e., BLK is the block length and BLK is an integer greater than one), and rearranging the order of the BLK values in the block. Interleaving may be employed, for example, to remove non-random sequences of values in a data stream, or may be employed to reduce effects of burst errors inserted into the block of data as the block of data passes through a transmission medium.

Such rearranging of data values may be considered a mapping f(*) as illustrated in FIG. 1. When a transmitter interleaves the data values d(0)–d(3) of a block (data values have associated address indices daddr (0) to daddr (BLK−1) in the block), a receiver reverses the interleaving of the data values in the block by de-interleaving. However, the only information available to the receiver are the data values themselves (with block boundaries) and the address indices addr(i) of the sequence of interleaved data values in the interleaved block. For any interleaving (mapping) algorithm, a corresponding de-interleaving algorithm performs the complementary function of the interleaving algorithm, and such algorithms may be optimized to reduce delay or processing required to accomplish the mapping of the de-interleaving algorithm. Consequently, the de-interleaving algorithms of the prior art may typically employ a different algorithm than that of the interleaving algorithm.

SUMMARY OF THE INVENTION

The present invention relates to de-interleaving an interleaved block of data values. A linear sequence of values is generated, each value corresponding to a position of a data value in the de-interleaved block; and a corresponding interleaved address for each value is generated based on a mapping employed to generate the interleaved block from an original block of data values. The position of each data value in the interleaved block is associated with an interleaved address; and each data value in the interleaved block is assigned to a position in the de-interleaved block identified by the value of the linear sequence corresponding to the interleaved address of the data value in the interleaved block.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
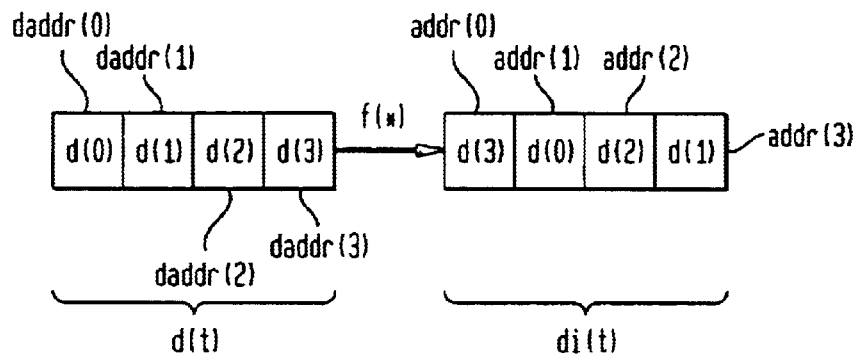
FIG. 1 shows mapping of data values of an input block to an interleaved block in accordance with an interleaving algorithm in the prior art.
Figure 2:
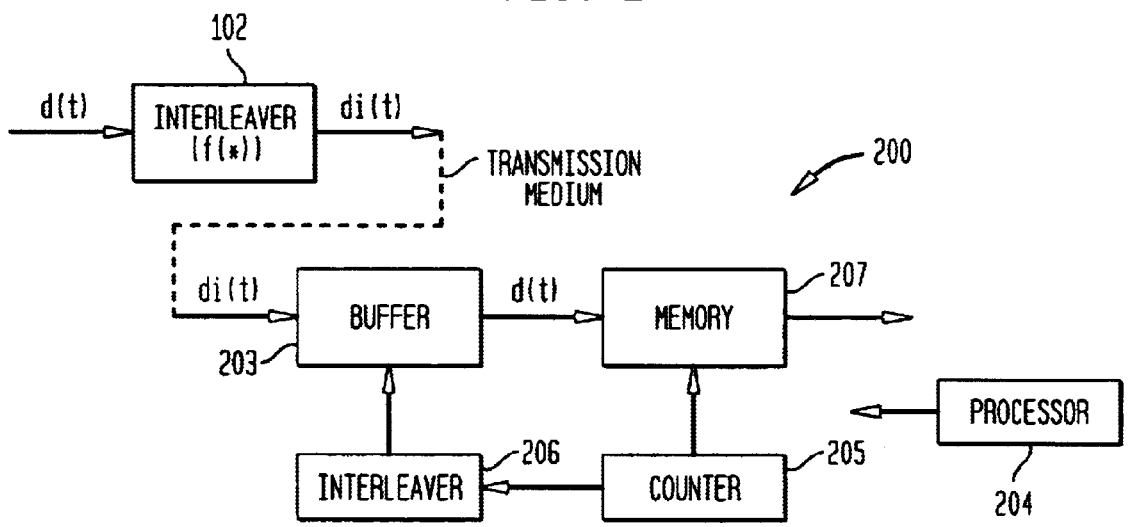
FIG. 2 shows an exemplary implementation of a de-interleaver in accordance with the present invention.
Figure 3:
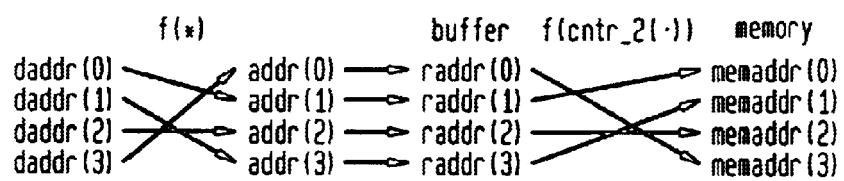
FIG. 3 illustrates a chain of address mapping for data values for a system including the exemplary implementation of FIG. 2.

Referring to FIG. 2, an interleaver 102 of a transmitter applies a particular interleaving algorithm f(*) to a sequence of BLK data values d(t) (i.e., an input block of length BLK, BLK an integer greater than 1) to generate an interleaved block di(t). The data values associated with address indices daddr (0) to daddr (BLK−1) of the block d(t) are mapped with the interleaving algorithm f(*) to a sequence of addresses with indices addr (0) to addr (BLK−1) in the interleaved block di(t). This mapping of addresses is shown in FIG. 3.

Interleaver 102 may employ a linear counter to generate a sequence of address values, cntr__1(i), for the data values in the block d(t). The sequence of address values, cntr__1(i), is associated with addresses daddr(i), $0 \leq i \leq BLK-1$, in the input block. Then, for example, cntr__1(0)=0 is associated with the first data value in the block, cntr__1(1)=1 is associated with the second address in the block and so on until cntr__1(BLK−1)=BLK−1 is associated with the final address in the block. Applying the interleaving algorithm f(*) to each value cntr__1(i) generates a corresponding value as an address addr(i), $0 \leq i \leq BLK-1$, in the interleaved block di(t). Thus, the interleaving algorithm f(*) applies the following mapping to the counter values cntr__1(i): f(cntr__1(0)) →addr(0), f(cntr__1(1))→addr(1), . . . ,f(cntr__1(BLK−1)) →addr(BLK−1).

Returning to FIG. 2, a receiver 200 operating in accordance with an exemplary implementation of the present invention receives from a transmission medium the interleaved data values of block di(t) into buffer 203. The information of block di(t) available to the receiver 200 are the data values and the corresponding sequential address indices, raddr(i), $0 \leq i \leq BLK-1$, of the data values of block di(t) in buffer 203. Receiver 200 further includes counter 205 and interleaver 206 and memory 207.

Interleaver 206 applies the interleaving algorithm f(*) to values generated by counter 205. In accordance with exemplary embodiments of the present invention, each value generated by interleaver 206 is employed as an address to identify a position of a data value in the interleaved block stored in buffer 203. The corresponding value of the counter 205 for the output value of the interleaver 206 is employed as an address to identify a position of the data value in the de-interleaved block. Swapping addresses for a data value between the corresponding pair of values generated by interleaver 206 and counter 205 may allow for: 1) reading out a de-interleaved block from buffer 203; or 2) storage, either in the buffer 203 or separate memory 207.

Each of the interleaved data values of block di(t) may be assigned a corresponding address memaddr(i) in memory 207 based on the output values of the counter 205 and interleaver 206. Optional processor 204 may be employed to detect block boundaries of di(t); to synchronize read, write, and other addressing operations; and to control or reset counter 205 and/or interleaver 206. As shown in FIG. 3, the address indices raddr(i) of the data values in block di(t) stored in buffer 203 correspond to address indices addr (i) provided by interleaver 102.

In accordance with embodiments of the present invention, the original sequence of data values d(t) is recovered from the interleaved sequence of values di(t). Counter 205 generates a sequence of values, cntr__2(i), $0 \leq i \leq BLK-1$, and interleaver 206 applies the interleaving algorithm f(*) to each value cntr__2(i) to provide an address sequence. Interleaved data values in di(t) may be assigned to addresses in memory 207 as described subsequently based on the pair of values provided by counter 205 and interleaver 206.

Counter 205 linearly counts to provide a sequence of address values, cntr_2(i) that are associated with the address values daddr(i) in the original sequence of data values d(t) before interleaving. Since a one-to-one mapping of f(*) of the interleaving operation is employed, applying the mapping f(*) to the values cntr_2(i) of the counter 205 generates the same sequence of addresses for raddr(0), raddr(1), ..., raddr(BLK−1) as that generated during the interleaving of block d(t) when the counter 205 sequentially steps from cntr_2(0) through cntr_2(BLK−1). Thus, for each received data value in the block di(t), the original address daddr(j) for the data value may be recovered from the interleaved sequence. The original address daddr(j) for the data value may be recovered by using the current address raddr(i) of the data value in the received interleaved sequence and then changing the address raddr(i) to cntr_2(j) because the value f(cntr_2(j))=raddr(i) (with 0<i,j<BLK−1). The change of address may typically occur when the received data value is assigned to memory location memaddr(j)=cntr_2(j).

For example, the address cntr_1(0)=0 is associated with the first data value in the original block d(t), and so the value of di(t) at address raddr (f(cntr_2(0))) in buffer 203 is assigned address memaddr(0) and stored at this location in memory 207. Similarly, the address cntr_1(1)=1 is associated with the second data value in the block d(t), and so the value of di(t) at address raddr (f(cntr_2(1))) in buffer 203 is assigned address memaddr(1) and stored at this location in memory 207. The assignment of data values in interleaved block di(t) continues until the address cntr_2(BLK−1)=BLK−1 is associated with the last data value in the block d(t), and so the value of di(t) at address raddr (f(cntr_2 (BLK−1))) in buffer 203 is assigned address memaddr (BLK−1) and stored at this location in memory 207. The association is shown in FIG. 3.

As would be apparent to one skilled in the art, the present invention need not be limited to writing data to a storage device from a buffer 203 as shown in FIG. 2. Modifications to the exemplary implementation of FIG. 2 may also be used to write data values as a reconstructed block d(t) output from buffer 203, or for direct storage of data values as a reconstructed block in memory 207 (without buffer 203) by writing data values directly to memory addresses as received, and then changing the address of each data value at the memory address identified by the corresponding value of interleaver 206 to the address identified by the counter 205. The operation may be summarized with the following pseudo-code:

For i=0 to (BLK−1):
  NUM=f(cntr_2(i));/the output of mapping algorithm by interleaving the counter value/data value (memaddr (cntr_2(i))=data value (raddr(NUM));*/setting address of data values in memory based on counter and interleaver addresses/*.
  end.

where "NUM" is a variable holding a temporary address value, "data value (memaddr(cntr_2(i)))" is the data value of the de-interleaved block stored in memory, and "data value (raddr(NUM))" is the data value of the interleaved block di(t).

A circuit and method of de-interleaving in accordance with the present invention may provide for the following advantages: 1) dual use of one mapping algorithm f(*) for both interleaving and de-interleaving; 2) reduced complexity of de-interleaving algorithms; and 3) a de-interleaver in accordance with the present invention operates for any implementation of interleaver, irrespective of the mapping f(*), with one-to-one mapping.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling,through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A circuit for de-interleaving an interleaved block to provide a de-interleaved block of data values comprising:
  a counter generating a linear sequence of values, each value in the linear sequence corresponding to a position of a data value in the de-interleaved block; and
  an interleaver generating a corresponding interleaved address for each value in the linear sequence based on a mapping employed to generate the interleaved block from an original block of data values, wherein:
  a position of each data value in the interleaved block is associated with an interleaved address and
  each data value is assigned to a position in the de-interleaved block, the position being identified by the value of the linear sequence that corresponds to the interleaved address of the data value in the interleaved block, wherein the value of the linear sequence is related to the corresponding interleaved address by the mapping.

2. The invention as recited in claim 1, further comprising a buffer for storing the interleaved block and a memory for storing the de-interleaved block, the interleaver generating each interleaved address identifying a position of a data value in the buffer and the counter generating a corresponding value identifying a position of the data value in the memory.

3. The invention as recited in claim 1, further comprising a memory, the memory storing the interleaved block and swapping a) the address of a position of a data value in the stored interleaved block identified by an interleaved address with b) the address of the corresponding value of the linear counter.

4. The invention as recited in claim 1, wherein the apparatus is embodied in an integrated circuit.

5. The invention as recited in claim 1, wherein the apparatus is embodied in either a transceiver or a handset of a telecommunications system.

6. A method of de-interleaving an interleaved block to provide a de-interleaved block of data values comprising the steps of:
   a) generating a linear sequence of values, each value in the linear sequence corresponding to a position of a data value in the de-interleaved block;
   b) generating a corresponding interleaved address for each value in the linear sequence based on a mapping employed to generate the interleaved block from an original block of data values;
   c) associating a position of each data value in the interleaved block with an interleaved address; and
   d) assigning each data value in the interleaved block to a position in the de-interleaved block, the position being identified by the value of the linear sequence that corresponds to the interleaved address of the data value in the interleaved block, wherein the value of the linear sequence is related to the corresponding interleaved address by the mapping.

7. The invention as recited in claim 6, further comprising the steps of storing the interleaved block in a buffer and storing the de-interleaved block in a memory, each interleaved address identifying a position of a data value in the buffer and the corresponding value identifying a position of the data value in the memory.

8. The invention as recited in claim 6, further comprising the step of swapping, in a memory storing the interleaved block, 1) the address of a position of a data value in the stored interleaved block identified by an interleaved address with 2) the address of the corresponding value of the linear counter.

9. Apparatus for de-interleaving an interleaved block to provide a de-interleaved block of data values comprising:
   a counter generating a linear sequence of values, each value in the linear sequence corresponding to a position of a data value in the de-interleaved block; and
   interleaving means for generating a corresponding interleaved address for each value in the linear sequence based on a mapping employed to generate the interleaved block from an original block of data values, wherein:
   a position of each data value in the interleaved block is associated with an interleaved address and
   each data value is assigned to a position in the de-interleaved block, the position being identified by the value of the linear sequence that corresponds to the interleaved address of the data value in the interleaved block, and the value of the linear sequence is related to the corresponding interleaved address by the mapping.

10. A computer-readable medium having stored thereon a plurality of instructions, the plurality of instructions including instructions which, when executed by a processor, cause the processor to implement a method for de-interleaving an interleaved block to provide a de-interleaved block of data values, the method comprising the steps of:
   a) generating a linear sequence of values, each value in the linear sequence corresponding to a position of a data value in the de-interleaved block;
   b) generating a corresponding interleaved address for each value in the linear sequence based on a mapping employed to generate the interleaved block from an original block of data values;
   c) associating a position of each data value in the interleaved block with an interleaved address; and
   d) assigning each data value in the interleaved block to a position in the de-interleaved block, the position being identified by the value of the linear sequence that corresponds to the interleaved address of the data value in the interleaved block, wherein the value of the linear sequence is related to the corresponding interleaved address by the mapping.

* * * * *